United States Patent
Seino et al.

(10) Patent No.: US 7,807,585 B2
(45) Date of Patent: Oct. 5, 2010

(54) METHOD OF FABRICATING A SEMICONDUCTOR DEVICE

(75) Inventors: Takuya Seino, Kawasaki (JP); Manabu Ikemoto, Sagamihara (JP); Hiroki Date, Tachikawa (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/611,088

(22) Filed: Nov. 2, 2009

(65) Prior Publication Data

US 2010/0075508 A1    Mar. 25, 2010

Related U.S. Application Data

(63) Continuation of application No. PCT/JP2007/059931, filed on May 15, 2007.

(51) Int. Cl.
*H01L 21/31* (2006.01)
*C23C 16/00* (2006.01)

(52) U.S. Cl. .................. 438/778; 438/308; 438/798; 438/906; 118/723 R

(58) Field of Classification Search .......... 438/308, 438/778, 795, 798, 906; 118/715, 723 R, 118/723 VE
See application file for complete search history.

(56) References Cited

U.S. PATENT DOCUMENTS

| | | | |
|---|---|---|---|
| 6,051,151 A * | 4/2000 | Keller et al. | 216/68 |
| 6,217,703 B1 * | 4/2001 | Kitagawa | 156/345.33 |
| 6,313,042 B1 | 11/2001 | Cohen et al. | |
| 6,511,575 B1 * | 1/2003 | Shindo et al. | 355/30 |
| 6,713,401 B2 | 3/2004 | Yokogawa et al. | |
| 6,955,973 B2 | 10/2005 | Niwa | |
| 6,977,229 B2 | 12/2005 | Yokogawa et al. | |
| 7,604,708 B2 * | 10/2009 | Wood et al. | 156/345.35 |
| 2002/0088972 A1 * | 7/2002 | Varhue et al. | 257/46 |
| 2007/0099806 A1 * | 5/2007 | Stewart et al. | 510/175 |
| 2008/0044589 A1 | 2/2008 | Ichikawa et al. | |

FOREIGN PATENT DOCUMENTS

| JP | 4-96226 A | 3/1992 |
|---|---|---|
| JP | 10-147877 A | 6/1998 |
| JP | 2001-102311 A | 4/2001 |
| JP | 2001-144028 A | 5/2001 |
| JP | 2002-217169 A | 8/2002 |
| JP | 2003-179049 A | 6/2003 |
| JP | 2004-63521 A | 2/2004 |

OTHER PUBLICATIONS

International Search Report, International Application No. PCT/JP2007/059931, Mailing Date Aug. 7, 2007.

* cited by examiner

*Primary Examiner*—Kevin M Picardat
(74) *Attorney, Agent, or Firm*—Fitzpatrick, Cella, Harper & Scinto

(57) ABSTRACT

A dielectric insulating film including HfO or the like is formed by: cleaning a surface of a semiconductor substrate by exposing the substrate surface to a fluorine radical; performing hydrogen termination processing with a fluorine radical or a hydride ($SiH_4$ or the like); sputtering Hf or the like; and then performing oxidation/nitridation. These steps are carried out without exposing the substrate to atmosphere, thereby making it possible to obtain a C-V curve with less hysteresis and realize a MOS-FET having favorable device characteristics.

21 Claims, 8 Drawing Sheets

| FIG. 6A |
| FIG. 6B |

TO STEP 616 OF FIG. 6

METHOD OF FABRICATING A SEMICONDUCTOR DEVICE

CROSS-REFERENCES TO RELATED APPLICATIONS

This application is a continuation application of International Application No. PCT/JP2007/059931, filed on May 15, 2007, the entire contents of which are incorporated by reference herein.

TECHNICAL FIELD

The present invention relates to method and apparatus for fabrication of a semiconductor device including cleaning of an Si-based surface.

BACKGROUND ART

It has been a conventional practice to subject a semiconductor Si substrate to wet cleaning. However, there have been problems that: complete removal of a water mark formed during drying and control of etching of a very thin oxide film cannot be achieved; and an apparatus has an increased size, and like problems. Further, when the semiconductor substrate is exposed to atmosphere for a long time after the wet cleaning of the semiconductor substrate, a surface of the semiconductor substrate forms a native oxide film thereon and adsorbs carbon atoms thereto, which results in problems including: film deposition of an Si single crystal being impossible; formation of a rough surface; and development of an impurity level at an interface with an gate insulating film.

In view of such problems, removal of an oxide film on the surface of the semiconductor substrate has been practiced by UHV vacuum heating at 750° C. or higher or heating in an $H_2$ atmosphere at 800° C. or higher before the film deposition. However, with progressing device miniaturization, a dielectric insulator film metal electrode is employed, which requires that a device be fabricated at a lower temperature. From now on, device fabrication at a temperature equal to or lower than 650° C. will be required. Therefore, the wet cleaning has limitations, and a dry cleaning method becomes necessary for processing the semiconductor substrate prior to the film deposition. An example of such a dry cleaning method is a reverse sputtering method using argon plasma (Japanese Patent Application Laid-Open No. H10-147877). With this method, however, it is considered that an Si—Si bond at the surface of the semiconductor substrate is also broken. In this case, there arise problems that: an oxide film is immediately formed at the Si deficient portion; adhesion of a contaminant substance to a dangling bond of Si is likely; and re-adhesion of oxide and contaminant substance resulting from sputtering to a sidewall occurs, and like problems. This will results in adverse effects on a later process (including impediment to epitaxial growth and formation of a high resistance portion at a silicide interface).

Damage to the device is also problematic. Japanese Patent Application Laid-Open No. 2001-102311 discloses a technique of taking out only a radical by turning a gas containing a halogen or hydrogen into plasma and then cleaning a semiconductor substrate with the radical. However, in cleaning the semiconductor substrate with an H radial, there arise problems including metallic contamination from the chamber used and overetching due to a high etch rate of an Si underlayer. Further, since re-adhesion of HF as a reaction product is likely, a sufficient F removal effect cannot be obtained. In cleaning the semiconductor substrate with an F radical, it has been impossible to remove F remaining on an Si surface and on an $SiO_2$ surface by heating at a temperature equal to or lower than 650° C. because the Si—F bond energy is high. In film deposition (in the case of UHF-epi) over the semiconductor substrate by allowing a material gas ($SiH_4$ gas) to flow over the semiconductor substrate in that condition, a problem has arisen that variations in incubation time (i.e., a time period until film deposition over the surface starts actually) occur between batches. Such variations make a time control of film thickness difficult between batches. Japanese Patent Application Laid-Open No. 2001-144028 discloses a technique of removing fluorine residue by exposing a semiconductor substrate to plasma containing fluorine-containing species to clean the substrate and then exposing the semiconductor substrate to an atmosphere which captures fluorine. The fluorine capturing atmosphere is prepared by plasma decomposition of a gas containing hydrogen-containing species.

However, since the semiconductor substrate is exposed to plasma, the Si—Si bond is also broken. In this case, there arise problems that: an oxide film is immediately formed at the Si deficient portion; adhesion of a contaminant substance to a dangling bond of Si is likely; and re-adhesion of oxide and contaminant substance resulting from sputtering to a sidewall occurs. This will results in adverse effects on a later process (including impediment to epitaxial growth and formation of a high resistance portion at a silicide interface). Damage to the device is also problematic. According to this known example, the gas is forcibly decomposed with plasma to generate a hydrogen group (i.e., H radical) and hydrogen ions. In removing fluorine residue remaining on the substrate surface by the hydrogen group (i.e., H radical) and hydrogen ions, there arise problems including metallic contamination from the chamber used and overetching due to a high etch rate of an Si underlayer. Further, since re-adhesion of HF as a reaction product is likely, a sufficient F removal effect cannot be obtained. Japanese Patent Application Laid-Open No. 2002-217169 discloses an apparatus which carries out a cleaning process for removing foreign matter in-situ by combination with a physical action of a frictional stress caused by a high-speed gas flow. According to the description of this known example, adsorption of impurities and occurrence of native oxidation are suppressed by transport under vacuum, which leads to an improved production efficiency. However, even though the foreign matter can be removed, a native oxide film and surface roughness remain on the surface atomic layer order. That is, in order to obtain the effect of improving the device characteristics by transport in-situ, it is necessary to provide a cleaning technique capable of controlling a surface on the atomic layer order, a technique of terminating the surface with a desired atom, and a technique of transport without exposure to atmosphere for film deposition. With these techniques, it is considered that favorable device characteristics can be obtained including reduced interface states at a semiconductor/dielectric insulator junction and reduced fixed charges in the film.

Patent Document 1: Japanese Patent Application Laid-Open No. H10-147877

Patent Document 2: Japanese Patent Application Laid-Open No. 2001-102311

Patent Document 3: Japanese Patent Application Laid-Open No. 2001-144028

Patent Document 4: Japanese Patent Application Laid-Open No. 2002-217169

DISCLOSURE OF THE INVENTION

With the prior art, an apparatus which performs surface cleaning processing requires transport under atmosphere to a subsequent film deposition step and, hence, components of atmosphere are adsorbed onto a substrate surface, which causes a native oxide film and impurities including carbon atoms to remain at the interface. Therefore, deterioration in device characteristics occurs. For this reason, an apparatus has been desired to be developed which, after impurity cleaning processing of the substrate surface, enables a device used in the subsequent step to start processing on the substrate immediately or transports the substrate under vacuum without exposure to atmosphere to allow the subsequent film deposition step to be performed.

As a result of study made by the inventors of the present invention to accomplish the above-described object, it has been found that a film free of carbon, moisture and a metal impurity at its interface can be deposited by a process including: the step of terminating a surface of a semiconductor substrate with fluorine by surface cleaning processing in which the semiconductor substrate is exposed to an atmosphere having a fluorine radical generated using $F_2$ (gas not containing hydrogen) or the step of terminating the substrate surface with hydrogen or fluorine by surface cleaning processing in which the semiconductor substrate is exposed to an atmosphere having a fluorine radical generated using an HF gas (gas containing hydrogen); exposing the surface terminated with fluorine or with hydrogen and fluorine by either of the above-described steps to a hydrogen radical, or exposing the semiconductor substrate to a hydride gas through a vacuum transfer chamber; and then performing sputter film deposition of any one of various dielectric materials including Hf. It has been also found that it is possible to form any one of various dielectric insulating films of HfO, HfON, HfN and the like which are free of carbon, moisture and a metal impurity at their respective interfaces, thereby to obtain favorable device characteristics by a process including: subjecting the hydrogen-terminated surface to plasma and radical oxidation or nitridation without exposure to atmosphere after the step of exposure to the hydrogen radical or the hydride; performing sputter film deposition of any one of various dielectric materials; and performing the plasma and radical oxidation or nitridation again. Further, it has been found that: in the step of the termination with fluorine or with hydrogen or fluorine, surface cleaning can be achieved without damaging the substrate surface and without impairing the planarity of the substrate surface by removal of a native oxide film and impurities present on the semiconductor substrate surface by the fluorine radical; and when the Si surface is terminated with fluorine by the step of the termination with fluorine or with hydrogen or fluorine, the subsequent film deposition step can be carried out with high reproducibility by a method of uniformly terminating the surface with hydrogen (H) which includes removal of fluorine (F) by exposure to the hydrogen radical or exposure to the hydride held at a temperature equal to or lower than the thermal decomposition temperature of the hydrogenated compound.

A film deposition apparatus according to the present invention has a vacuum transfer chamber and is capable of performing sputter film deposition of a dielectric material (Hf, HfSi, HfLa, or the like) without exposing the surface terminated with hydrogen to atmosphere, thereby suppressing absorption of carbon and moisture to the interface of the film.

Since the film deposition apparatus according to the present invention is capable of plasma and radical oxidation, nitridation or oxynitridation of the surface terminated with hydrogen or the surface of the film deposited by sputter deposition of a dielectric material without exposure to atmosphere, it is possible to suppress absorption of carbon and moisture to the interface, thereby to modify the surface without impurities.

The apparatus according to the present invention includes controllers for carrying out a series of processes in-situ, the controllers being each provided at a respective one of devices including processing devices and a transport device. That is, a transport controller is configured to receive an input signal from the device at its input section, cause a processor to execute a transport program programmed for an operation to be performed according to a flowchart, and output to the device an instruction to perform a next operation. Process controllers are each configured to receive an input signal from a respective one of film deposition devices, cause a processor to execute a film deposition program programmed for an operation to be performed according to a flowchart, and output to the device an instruction to perform a next operation.

The present invention makes it possible to remove a native oxide film and contaminant substances, such as carbon and moisture, present on the semiconductor substrate surface, as well as contaminant substances present on a surface resulting from film deposition. Also, variations in incubation time (i.e., a time period until film deposition over the surface starts actually) between batches are eliminated in the film deposition. Also, the time control of film thickness between batches is made easy. It becomes possible to remove F from the semiconductor substrate surface and terminate the surface with H in order to remove a native oxide film and contamination from the semiconductor substrate surface by the process including: performing the first step of exposing the semiconductor substrate to an atmosphere containing a radial comprising a halogen as a constituent element; and then exposing the semiconductor substrate surface containing a metal, semiconductor or dielectric material having residual F to a hydrogenated compound gas to allow the gas to react with residual F on the semiconductor substrate surface. This process does not need any special apparatus and can prevent the semiconductor substrate surface from metallic contamination and plasma damage. Since the present invention is able to obtain a desired effect by causing reaction to occur with only a predetermined portion of the substrate efficiently, it is possible to reduce the cost and enhance the processing speed. That is, cleaning of the semiconductor substrate surface is achieved in a shortened time efficiently without metallic contamination and plasma damage by using a simplified and less costly apparatus configuration, Thus, it is possible to obtain a high-quality single crystal Si film or SiGe film with high reproducibility after the first step. The semiconductor/insulator junction formed by the process including performing sputter film deposition of a dielectric material without exposure to atmosphere after the first and second steps or the process including: performing the fourth step of oxidation, nitridation or oxynitridation after the second step; performing sputter film deposition of a dielectric material without exposure to atmosphere; and again performing the fourth step of oxidation, nitridation or oxynitridation, had reduced impurities at the interface as compared with the case of transport under atmosphere. Therefore, it is possible to obtain an interface state density and a fixed charge density in the film which are comparable to those of a conventional oxide film, a C-V curve with less hysteresis and reduced leakage current, thereby to obtain favorable device characteristics.

BEST MODES FOR CARRYING OUT THE INVENTION

Embodiments of the present invention will be described below.

Embodiment 1

Figure 1:
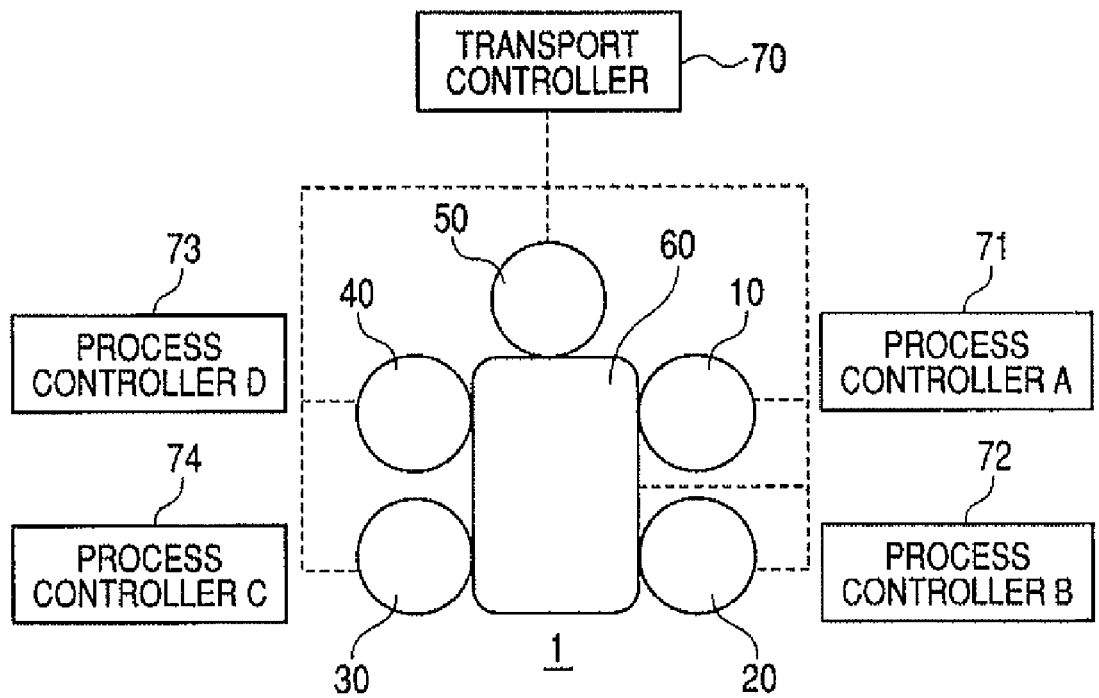
FIG. 1 is a schematic view illustrating an exemplary configuration of a film deposition apparatus used in the present invention.

FIG. 1 illustrates a configuration of a film deposition apparatus 1 including a surface cleaning device 10, a CVD film deposition device 20, an oxidation/nitridation device 30, a dielectric sputter device 40 and a load lock device 50, which are disposed around a central transfer chamber 60. These devices 10, 20, 30 and 40 communicate with the transfer chamber 60 via passages which allow a substrate for film deposition for a tray carrying the substrate thereon) to be passed and moved therethrough. The passages are each provided with a hermetic shutter, closing and opening of which is controlled by a transport controller 70. Transport or processing of the substrate in the devices 10, 20, 30, 40 and 50 is controlled by a transport processor or respective process controllers 70 to 74.

Figure 3:
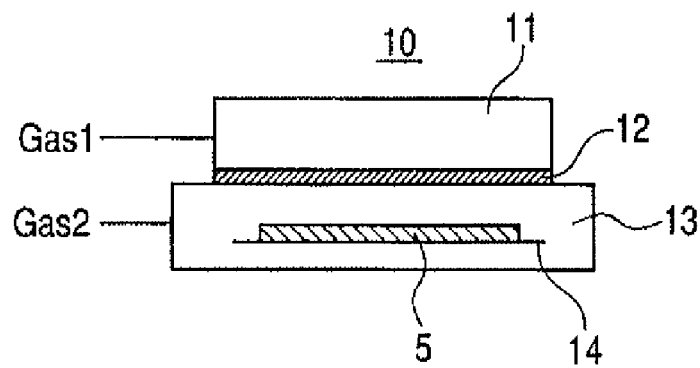
FIG. 3 is a schematic view illustrating an exemplary configuration of a plasma surface cleaning device used in the present invention.

In the present embodiment, description is directed to a process in the film deposition apparatus 1 illustrated in FIG. 1, including: performing a first step using the surface cleaning device 10 illustrated in FIG. 3 to remove a native oxide film formed on an Si substrate; performing a second step to cause termination with hydrogen to be made using the CVD film deposition device 20; performing a third step of performing sputter film deposition of a dielectric material by the sputter device 40; and a fourth step of oxidizing the dielectric material by the oxidation/nitridation device 30. The substrate used as a sample is an Si single crystal substrate 5 having a diameter of 300 mm which is coated with the native oxide film by having been allowed to stand in clean air. The interior of the transfer chamber has been evacuated to a vacuum equal to or less than 1 Pa by drawing a vacuum by the load lock device 50. The substrate is transported onto a substrate holder 14 of the surface cleaning device 10 through the vacuum transfer chamber 60, followed by closure of the associated hermetic shutter.

Subsequently, in the surface cleaning device 10 illustrated in FIG. 3, a plasma chamber 11 was supplied with a halogen gas $F_2$ using Ar as a carrier gas at 100 sccm from a supply pipe Gas1 to generate plasma in the plasma chamber 11. The plasma was then allowed to flow into a reaction chamber 13 through a radical shower plate 12, and the reaction chamber 13 was supplied with HF or $H_2$ from a supply pipe Gas2. HF was supplied at 100 sccm or $H_2$ supplied at 50 sccm under the conditions that the pressure was 50 Pa and the substrate temperature of the Si single crystal substrate 5 on the substrate holder 14 was 300° C. The etching rate of the oxide film increases as the pressure lowers. The etching rate decreases as the temperature lowers. By exposing the substrate surface to the fluorine radical, the native oxide film was able to be removed without impairment to the surface planarity. The substrate surface thus obtained contains termination with fluorine. Thereafter, the hermetic shutter was opened and the substrate 5 was moved from the cleaning device 10 to the CVD film deposition device 20 through the vacuum transfer chamber 60, thereby transporting the substrate 5 having been subjected to cleaning to the CVD film deposition device 20 configured to perform the second step of termination with hydrogen, without exposure to atmosphere. $SiH_4$ was supplied at 100 sccm with the substrate temperature set at 300° C. Here, the pressure was 3E-3 Pa. This step made it possible to replace the F termination remaining after the first step of cleaning with hydrogen, thereby to change the F termination into termination with hydrogen. Further, in order to perform the third step, the substrate was transported from the CVD film deposition device 20 illustrated in FIG. 1 to the dielectric sputter device 40 through the vacuum transfer chamber 60 without exposing the hydrogen-terminated surface to atmosphere. As a result of sputter film deposition of Hf, HfSi or the like, a dielectric film of such a material was formed. The dielectric film thus formed was confirmed to be free of an impurity such as carbon or metal at the interface thereof as compared with the case of transport under atmosphere. Thereafter, the substrate was transported to the oxidation/nitridation device 30 through the vacuum transfer chamber 60 without exposure of the dielectric material surface to atmosphere in order to oxidize the deposited film of the dielectric material and then subjected to plasma and radical oxidation therein. As a result of evaluation of device characteristics, data illustrated in FIGS. 8 to 11 was obtained.

Figure 8:
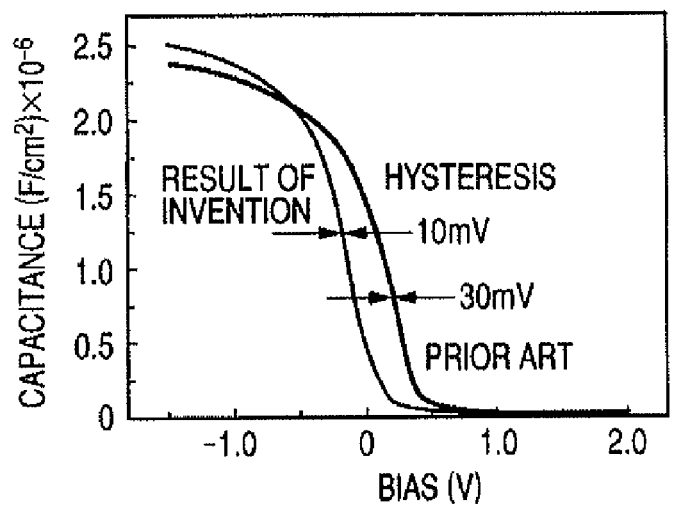
FIG. 8 is a view illustrating a C-V curve obtained by embodiment 1 of the present invention.

FIG. 8 is a C-V curve obtained by embodiment 1 of the present invention. Sputter deposited dielectric films prepared as samples of embodiment 1 and the prior art were each provided with electrodes and applied with voltage to measure their respective capacitances. The results of measurement are illustrated in FIG. 8. According to the results, embodiment 1 exhibited a hysteresis as small as 10 mV as compared with the prior art exhibiting a hysteresis of about 30 mV.

Figure 9:
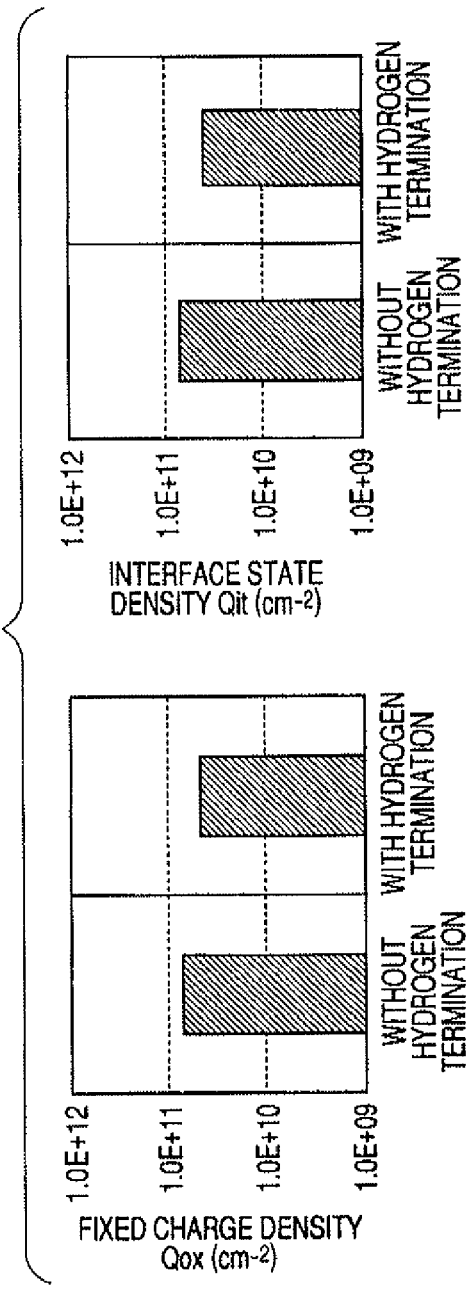
FIG. 9 is a view illustrating an exemplary comparison as to the interface state density and fixed charge density obtained by embodiment 1 of the present invention between a process with the step of termination with hydrogen and a process without the step of termination with hydrogen.

FIG. 9 illustrates an exemplary comparison as to the interface state density and fixed charge density obtained by embodiment 1 of the present invention between a process with the step of termination with hydrogen and a process without the step of termination with hydrogen. Samples were prepared by the process with termination with hydrogen and the process without termination with hydrogen. The interface state densities and fixed charge densities of the respective samples were calculated from the C-V curves. As a result, the fixed charge densities were equal to or less than $1\times10^{11}$ cm$^{-2}$ and the interface state densities were equal to or less than $1\times10^{11}$ cm$^{-2}$, which proved that the fixed charge density and interface state density obtained by the process with termination with hydrogen were comparable to those obtained by the process without termination with hydrogen.

Since the amounts of impurities present at the interface were smaller than in the case of transport under atmosphere, it was possible to obtain the interface state density and the fixed charge density in the film which were comparable to those of a conventional oxide film and a favorable C-V curve with less hysteresis, as well as to reduce the leakage current.

Figure 4:
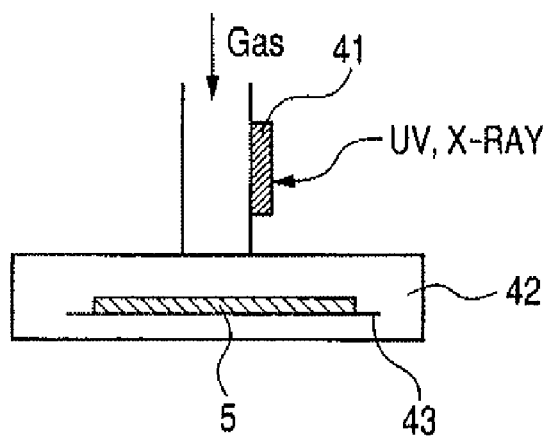
FIG. 4 is a schematic view illustrating an exemplary configuration of a UV- or X-ray excited radical surface cleaning device used in the present invention.
Figure 5:
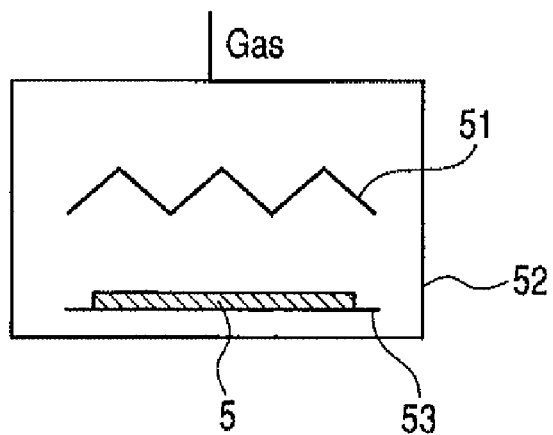
FIG. 5 is a schematic view illustrating an exemplary configuration of a catalytic chemical excited radical surface cleaning device used in the present invention.

The surface cleaning device illustrated in FIG. 3 has a configuration in which the plasma generating chamber 11 and the processing chamber 13 are separated from each other by the shower plate 12 and hence enables the processing chamber 13 to perform processing using a radical mainly. Since an etching reaction based on $HF_2^-$ ions is predominant, a native oxide film removal processing having a high selective ratio between $SiO_2$ and Si can be performed without damage to the substrate 5. The radical may be generated by a UV- or X-ray excited device illustrated in FIG. 4 or catalytic chemical excitation illustrated in FIG. 5.

Gas1 for introduction into the plasma chamber uses an $F_2$ or HF gas using Ar, Kr, Xr or He as a carrier gas to generate plasma. By passing the plasma through the shower plate, the radical is introduced into the processing chamber 13. Further, Gas2 for introduction into the processing chamber 13 uses an HF or $H_2$ gas to enable removal of the native oxide film present on the surface.

Embodiment 2

In the present embodiment, description is directed to a process using the film deposition apparatus 1 illustrated in FIG. 1, including: performing a first step using the surface cleaning device 10 illustrated in FIG. 3 to remove a native oxide film formed on an Si substrate; performing a second step to cause termination with hydrogen to be made by the CVD film deposition device 20 (the same processing up to here as in embodiment 1); moving the substrate thus processed into the oxidation/nitridation device 30 through the transfer chamber 60 to perform a fourth step of oxidation, nitridation or oxynitridation; performing a third step of sputter film deposition of a dielectric material; and again moving the substrate into the oxidation/nitridation device 30 through the transfer chamber 60 to perform the fourth step of oxidation, nitridation or oxynitridation. The substrate used as a sample is an Si single crystal substrate 5 having a diameter of 300 mm which is coated with the native oxide film by having been allowed to stand in clean air. The substrate was transported into the surface cleaning device 10 through the vacuum transfer chamber 60. Subsequently, in the surface cleaning device 10 illustrated in FIG. 3, the supply pipe Gas1 was supplied with a halogen gas $F_2$ using Ar as a carrier gas at 100 sccm to generate plasma in the plasma chamber 11, and the supply pipe Gas2 was supplied with HF or $H_2$. HF was supplied at 100 sccm or $H_2$ supplied at 50 sccm under the conditions that the pressure was 50 Pa and the substrate temperature was 300° C. The etching rate of the oxide film increases as the pressure lowers. The etching rate decreases as the temperature lowers. By exposing the substrate surface to the plasma, the native oxide film was able to be removed without impairment to the surface planarity. Thereafter, the substrate 5 was transported to the CVD film deposition device 20 configured to perform the second step through the vacuum transfer chamber 60 without exposure to atmosphere. $SiH_4$ was supplied at 100 sccm with the substrate temperature set at 300° C. Here, the pressure was 3E-3 Pa. This step made it possible to change the F termination remaining after the first step into termination with hydrogen.

Figure 12:
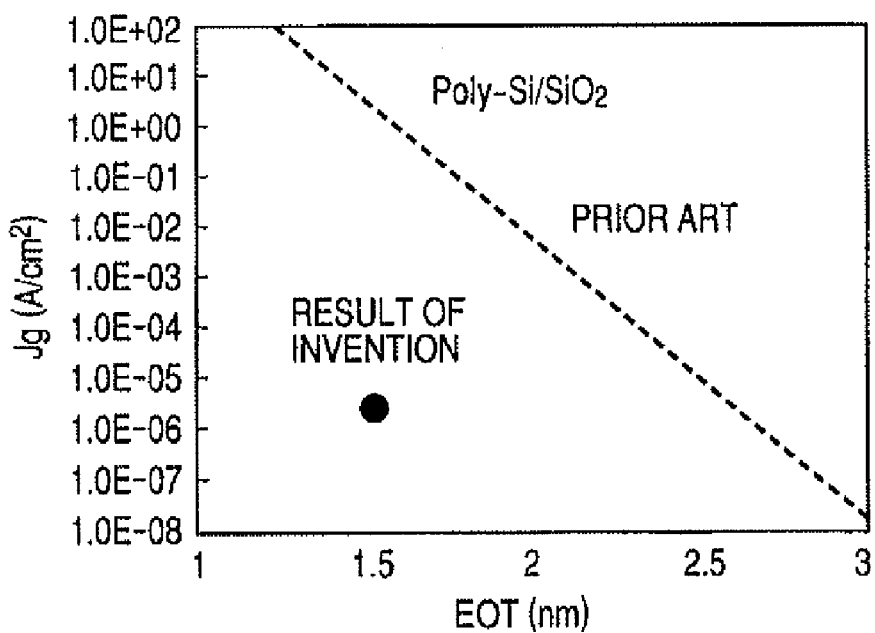
FIG. 12 is a graph illustrating a relationship between an equivalent oxide thickness (EOT) obtained by embodiment 2 of the present invention and leakage current.

Further, in order to perform the fourth step, the substrate was transported from the CVD film deposition device 20 to the oxidation/nitridation device 30 illustrated in FIG. 1 through the transfer chamber without exposing the hydrogen-terminated surface to atmosphere and then subjected to plasma and radical oxidation, nitridation or oxynitridation. Thereafter, the substrate was transported from the oxidation/nitridation device 30 to the dielectric sputter device 40 through the transfer chamber 60 without exposure to atmosphere. As a result of sputter film deposition of Hf or HfSi, a dielectric film of Hf was formed. The dielectric film thus formed was confirmed to be free of an impurity such as carbon or metal at the interface thereof as compared with the case of transport under atmosphere. Thereafter, the substrate was transported to the oxidation/nitridation device 30 through the vacuum transfer chamber 60 without exposing the dielectric material surface to atmosphere in order to oxidize the deposited film of the dielectric material and then subjected to plasma and radical oxidation therein. As a result of evaluation of device characteristics, the leakage current was able to be reduced as compared the case including transport under atmosphere, as can be seen from FIG. 12.

Figure 10:
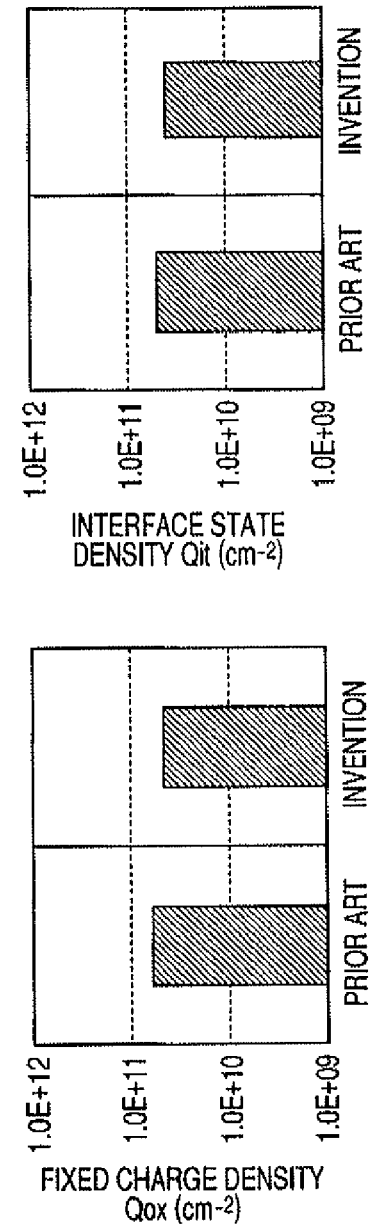
FIG. 10 is a view illustrating an exemplary comparison between the interface state density and fixed charge density obtained by embodiment 1 of the present invention and those of a conventional oxide film.
Figure 11:
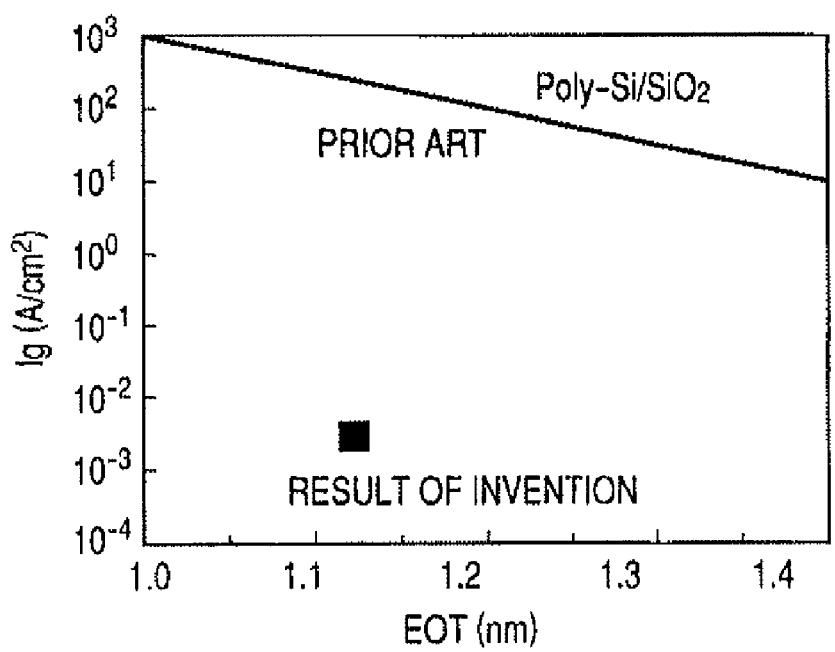
FIG. 11 is a graph illustrating a relationship between an equivalent oxide thickness (EOT) obtained by embodiment 1 of the present invention and leakage current.

FIG. 10 illustrates an exemplary comparison between the interface state density and fixed charge density obtained by embodiment 2 of the present invention and those of a conventional oxide film. The interface state densities and fixed charge densities of respective samples prepared according to embodiment 2 and the prior art were calculated from the C-V curves of the respective samples. As a result, the fixed charge densities were equal to or less than $1\times10^{11}$ cm$^{-2}$ and the interface state densities were equal to or less than $1\times10^{11}$ cm$^{-2}$, which proved that the characteristics obtained according to embodiment 1 were comparable to those obtained according to the prior art.

Embodiment 3

In the present embodiment, description is directed to a method which is different from the foregoing embodiments 1 and 2 each having the process using the film deposition apparatus 1 illustrated in FIG. 1, including: performing the first step using the surface cleaning device 10 illustrated in FIG. 3 to remove the native oxide film formed on the Si substrate; and then terminating the surface with hydrogen. The substrate used as a sample is coated with an $SiO_2$ film having a test pattern defining an uncovered circular Si region having a diameter of about 3 μm. After removal of the native oxide film by the surface cleaning device 10 in the same manner as in the foregoing embodiment 1, the substrate was processed for 10 sec in the same surface cleaning device 10 which was supplied with $SiH_4$ at 5 sccm from the supply pipe Gas2 under the conditions that the substrate temperature was 300° C. and the pressure was held at 10 Pa. That is, the substrate surface is subjected to processing with $SiH_4$ after the cleaning with fluorine. Thereafter, the substrate was transported to the CVD device 20 configured to perform the second step through the vacuum transfer chamber 60 and then subjected to processing for 10 min in the CVD device 20 which was supplied with $SiH_4$ at 10 sccm under the conditions that the substrate temperature was 600° C. and the pressure was held at 10-2 Pa.

With embodiments 1 and 2 each having no processing with $SiH_4$ after the first step of cleaning, the incubation time is relatively long and the hydride remains incomplete, which causes variations in film deposition start time between substrate processing batches to occur. With embodiment 3 which performs the processing with $SiH_4$ after the first step, the incubation time is relatively short, the surface is completely terminated with hydrogen, and there are no variations in film deposition start time between the batches. By performing the surface cleaning in the first step, it was possible to shorten the Si or SiGe film deposition time and allow the film to grow with high reproducibility. This is because the growth of Si or SiGe was facilitated by removal of impurities adsorbed on the surface as well as by termination of the surface with hydrogen.

According to embodiment 3, the substrate is exposed to the hydride gas with its substrate surface temperature held at a temperature equal to or lower than the thermal decomposition temperature of the hydrogenated compound in the same device or after having been transported to the CVD film deposition device without exposure to atmosphere, whereby F adhering to the semiconductor substrate surface in the fluorine termination step is removed and the surface of the semiconductor substrate (even when Si, $SiO_2$ and the like coexist on the substrate by patterning) is uniformly terminated with hydrogen. In the case of film deposition of Si, SiGe or the like, a single crystal can be grown using the CVD device by raising the substrate temperature to a temperature equal to or higher than the thermal decomposition temperature of the hydrogenated compound and then exposing the hydrogen- or F-terminated surface to an $SiH_4$ or $GeH_4$ gas.

In the step of exposure to the hydride, the surface is uniformly terminated with hydrogen by setting the temperature of the substrate having been subjected to the fluorine termination step to a temperature equal to or lower than the thermal decomposition temperature of the hydrogenated compound; specifically, equal to or lower than 450° C. when the hydride is $SiH_4$, equal to or lower than 280° C. when the hydride is $GeH_4$, and equal to or lower than 300° C. when the hydride is $Si_2H_6$.

Conditions to be satisfied by a gas which can be used for hydrogen termination processing in the step of exposure to the hydride include the following conditions (1) to (4):
(1) The gas is a hydrogenated gas which causes thermal dissociation at a temperature equal to or lower than 650° C.;
(2) A volatile metal halide is produced as a reaction product;
(3) The metal does not serve as a source of contaminant to the device. Desirably, the gas is a gas to be used in the later film deposition step; and
(4) The gas is free of C. Deposition of a carbon compound impedes film deposition.

Hydride gases which satisfy all the conditions (1) to (4) include $SiH_4$, $GeH_4$, and $Si_2H_6$. When the film to be deposited is doped, use of $AsH_3$, $PH_3$ or $B_2H_6$ is possible. ($H_2$ has high bond energy and hence is not dissociated by reaction with the halogen adhering to the semiconductor substrate surface. For this reason, a temperature equal to or higher than 800° C. is needed in order to remove $H_2$ by reaction with the halogen. However, the device requests that the temperature of the semiconductor substrate should be equal to or lower than 650° C. A hydrogen gas has a low reaction rate with F and produces HF, which is prone to re-adhesion, as a reaction product. Therefore, a satisfactory effect of F removal cannot be obtained.)

Further, in the hydrogen termination processing in the step of exposure to the hydride gas, unlike the conditions for stabilizing the $SiH_4$ gas used for film deposition, the temperature, pressure and time conditions under which the semiconductor substrate is exposed to the hydrogenated compound gas ($SiH_4$) for reaction with F on the semiconductor substrate surface to remove F and terminate the surface with H, need to satisfy the following requirements.

(1) Temperature

When a halogen, such as fluorine, is present on the surface of the semiconductor substrate at a temperature equal to or lower than the thermal decomposition temperature of the hydrogenated compound gas, the hydrogenated compound gas is decomposed only by reaction with the halogen. Since $SiH_4$, for example, is thermally decomposed at 450° C., $SiH_4$ reacts with the halogen at the substrate surface to decompose when the temperature of the substrate to which the halogen adheres is lower than 450° C. When the substrate temperature becomes equal to or higher than 450° C., $SiH_4$ is thermally decomposed at the substrate surface to cause nucleation of Si at the substrate surface, which will disorder the crystal structure of a film to be deposited thereon and hinder the amount of a dopant of the film and the concentration ratio from being controlled. (During film deposition, $SiH_4$ momentarily flows over the substrate at a high temperature prior to electric discharge, which is not problematic because the processing condition can be set constant for the batches every time while the duration of such a flow is short.) Therefore, the temperature of the semiconductor substrate exposed to the hydrogenated compound gas needs to be set lower than the thermal decomposition temperature of the hydrogenated compound gas. (Desirably, the substrate temperature is such a high degree as to allow the reaction to proceed adequately.)

When the hydrogenated compound gas is $SiH_4$, the substrate temperature is equal to or lower than about 450° C.
When the hydrogenated compound gas is $GeH_4$, the substrate temperature is equal to or lower than about 280° C.
When the hydrogenated compound gas is $Si_2H_6$, the substrate temperature is equal to or lower than about 300° C.

(2) Pressure

The pressure ranges from $10^{-2}$ Pa to $10^1$ Pa. The pressure needs to be high enough to cause reaction to occur and low to such an extent as not cause re-adhesion to occur. The pressure for film deposition is $10^{-2}$ to $10^0$ Pa in the case of URV-epi, $10^{-1}$ to $10^2$ Pa in the case of PCVD-depo, and $10^{-1}$ to $10^0$ Pa in the case of PVD.

(3) Time

The $SiH_4$ gas is allowed to flow over the Si surface terminated with F for at least 1 min which is equivalent to Si etching of 2 nm to remove F and terminate the surface with H at the same time.

Figure 2:
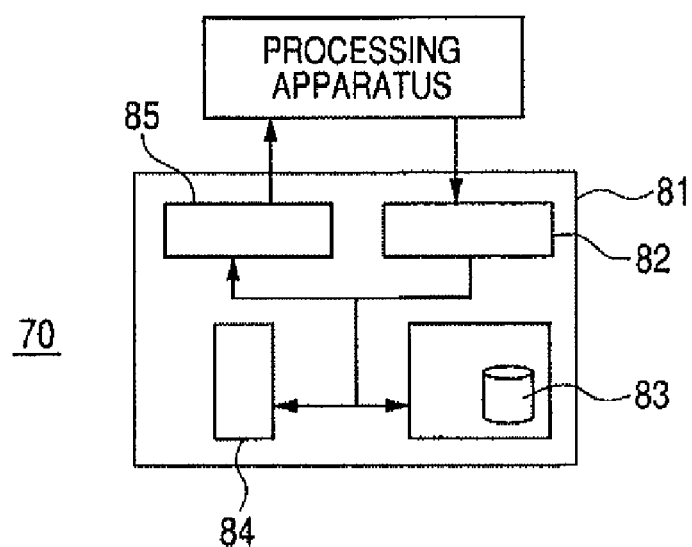
FIG. 2 is a schematic view illustrating a controller provided in the apparatus used in the present invention.

The film deposition apparatus 1 illustrated in FIG. 1 includes controllers for carrying out a series of processes in-situ, the controllers being each provided at a respective one of the devices including the processing devices and the transport device. That is, a transport controller 70 is configured to receive an input signal from the associated device at its input section, cause a processor to execute a transport program programmed for an operation to be performed according to a flowchart, and output to the device an instruction to move the substrate from one processing device to another through vacuum transfer. Process controllers A to D (71 to 74) are each configured to receive an input signal from a respective one of the processing devices, execute a program programmed for processing to be performed according to a flowchart, and output to the processing device an instruction to perform an operation. FIG. 2 illustrates a configuration of the controller 70 or each of the controllers 71 to 74, comprising an input section 82, a storage section 83 having the program and data, a processor 84, and an output section 85. Basically, each controller has a computer configuration for controlling the associated processing apparatus.

Figures 6, 6A:
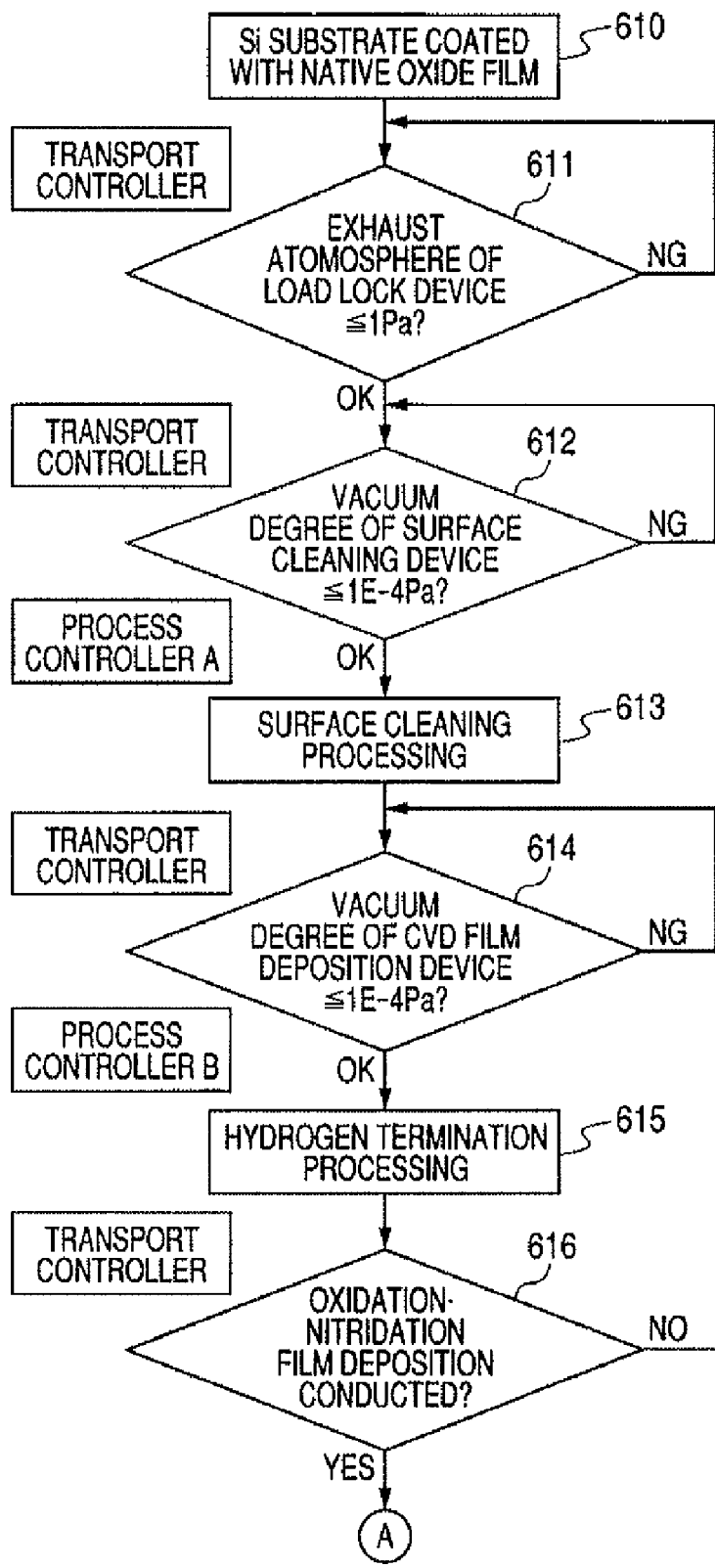
FIG. 6 is a flowchart of a transport controller program used in the present invention.
Figure 6B:
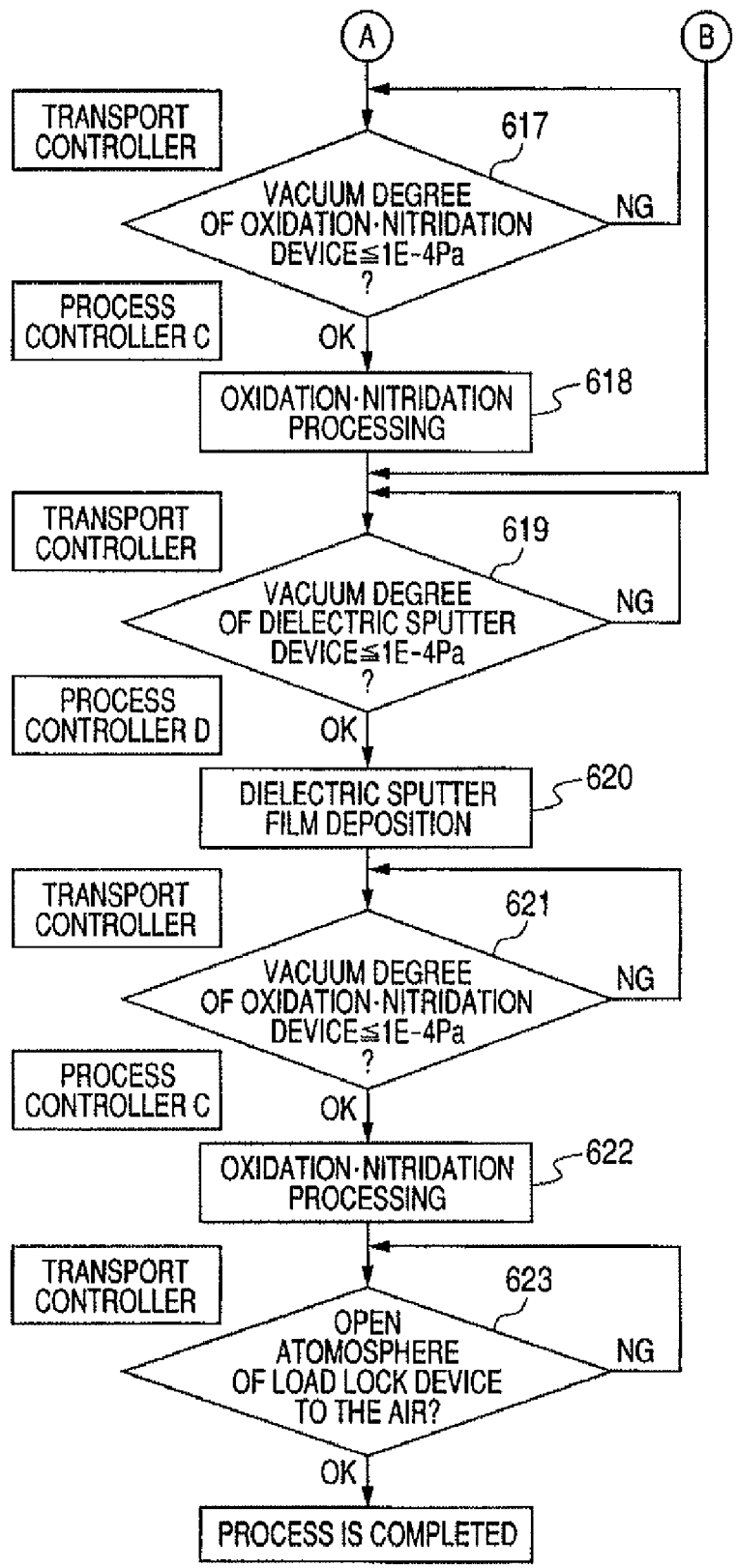

FIG. 6 illustrates a control performed by the transport controller 70 and the process controllers A to D (71 to 74). An Si substrate coated with a native oxide film is provided in step 610. The transport controller 70 performs a control so that the transfer chamber is conditioned by the load lock device 50 (step 611). Further, the transport controller 70 issues an instruction to adjust the degree of vacuum of the surface cleaning device 10 to 1E-4 Pa or more and causes the substrate S to move into the surface cleaning device 10 through the transfer chamber 60 and to be placed on the substrate holder. The process controller A71 controls the procedure for subjecting the substrate 5 to the surface cleaning processing described in any one of the foregoing embodiments 1 to 3 (step 613).

The transport controller 70 performs a control so that the CVD film deposition device 20 is evacuated to a degree of vacuum equal to or less than 1E-4 Pa and then causes the substrate 5 in the surface cleaning device 10 to move into the CVD film deposition device 20 through the transfer chamber 60.

The process controller B72 performs a control so that the hydrogen termination processing described in any one of the foregoing embodiments 1 to 3 is performed in the CVD film deposition device 20 (step 615). The transport controller controls differently according to whether to perform dielectric sputter film deposition processing immediately thereafter as in embodiment 1 or to perform oxidation/nitridation film deposition processing as in embodiment 2 (step 616). In the case of embodiment 1, the transport controller sets the degree of vacuum in the dielectric sputter device 40 to 1E-4 Pa or less and causes the substrate 5 terminated with hydrogen in the CVD film deposition device 20 to move into the dielectric sputter device 40 through the transfer chamber 60 (step 619).

The process controller D73 performs a control so that the film deposition processing according to any one of embodiments 1 to 3 is performed in the dielectric sputter device 40 (step 620). As in embodiment 1, the transport controller 70 sets the degree of vacuum in the oxidation/nitridation device 30 to 1E-4 Pa or less and causes the substrate 5 in the dielectric sputter device 40 to move into the oxidation/nitridation device 30 through the transfer chamber 60 (step 621). The process controller C74 performs a control so that the processing according to embodiment 1 is performed in the oxidation/nitridation device 30 (step 622). Thereafter, the transport controller 70 causes the load lock device 50 to open the interior of the transfer chamber 60 to atmosphere (step 623).

In the case of embodiment 2, on the other hand, the transport controller 70 sets the degree of vacuum in the oxidation/nitridation device 30 to 1E-4 Pa or less and then causes the hydrogen-terminated substrate 5 in the CVD film deposition device 20 to move into the oxidation/nitridation device 30 through the transfer chamber 60 (step 617). The process controller C74 performs a control so that oxidation/nitridation device 30 performs the processing according to embodiment 2 or its processing therein (step 618). A control to be performed after the oxidation/nitridation processing is the same as in embodiment 1. Thus, the control of the apparatus according to the invention is ended.

Figure 7:
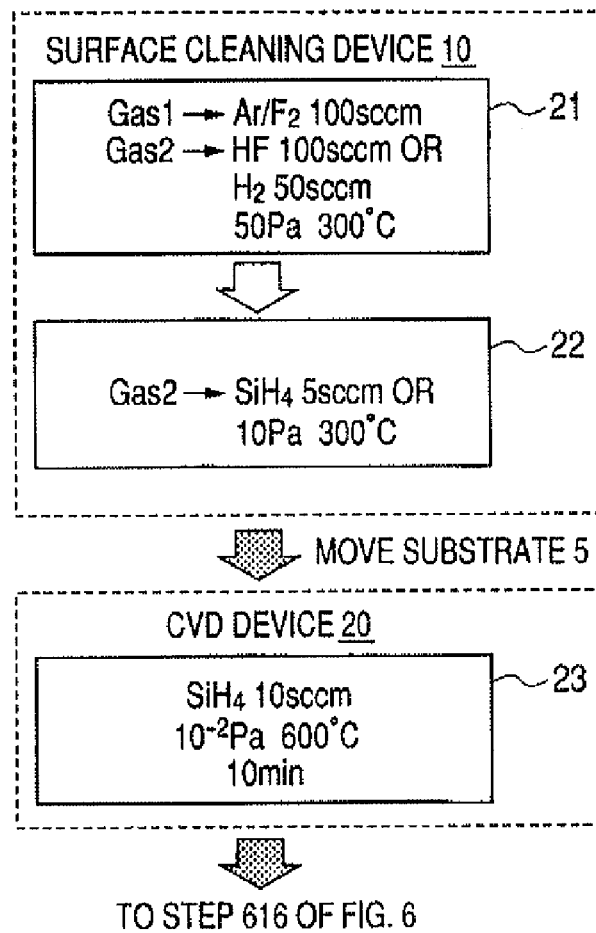
FIG. 7 is a flowchart of a film deposition controller program used in the present invention.

FIG. 7 illustrates processing steps 21 and 22 in the surface cleaning device 10 and processing step 23 in the CVD device according to the foregoing embodiment 3. The step 21 is the same processing as in embodiments 1 and 2. The step 22 is additional processing for 10 sec under the conditions that; $SiH_4$ is supplied at 5 sccm from the supply pipe Gas2; the substrate temperature is set to 300° C.; and the pressure is set to 10 Pa. Thereafter, the substrate 5 is moved into the CVD device 20 and then subjected to hydrogen termination processing. This processing is performed for 10 min in step 23 under the conditions that: $SiH_4$ is supplied at 10 sccm; the substrate temperature is set to 600° C.; and the pressure is held at 10-2 Pa.

Figure 13:
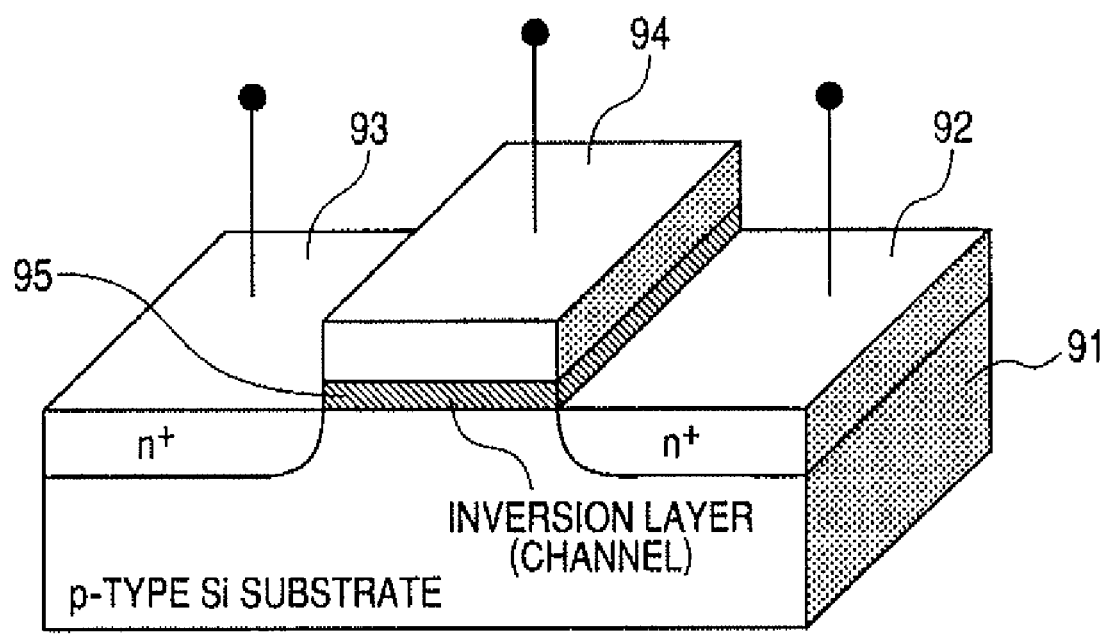
FIG. 13 is a view illustrating a structure of a MOS-FET fabricated by the film deposition apparatus according to the present invention.

A MOS field effect transistor (FET) 90 illustrated in FIG. 13 was fabricated by the above-described process according to the present invention. An HfO film was used as a dielectric gate insulating film 95 underlying a gate electrode 94 located between a source region 92 and a drain region 93 of an Si substrate 91. Other usable materials for the gate insulating film 95 include HfN, HfON, HfLaO, HfLaN, HfLaON, HfAlLaO, HfAlLaN, HfAlLaON, LaAlO, LaAlN, LaAlON, LaO, LaN, and LaON. The dielectric constant of these materials falls within a range from 3.9 to 100. The fixed charge density ranges from 0 to $1\times10^{11}$ cm$^{-2}$. The gate insulating layer had a thickness ranging from 0.5 to 5.0 nm. The interface state density is equal to or less than $1\times10^{11}$ cm$^{-2}$. The gate insulating film exhibits an improved hysteresis characteristic (10 mV) illustrated in FIG. 8.

The "fixed charge" as used herein, otherwise called "fixed oxide charge", means a charge which is present in an $SiO_2$ film and is in a fixed state without being moved by an electric field or the like. The fixed oxide charge is produced by a structural defect of an oxide film and depends upon the condition of formation of the oxide film and a heat treatment. Usually, a positive fixed charge caused by a dangling bond of silicon is present at an Si—$SiO_2$ interface. The fixed oxide charge causes the C-V characteristic of a MOS structure to be translated along the gate voltage axis. The fixed charge density is measured by a C-V method.

The gate electrode 94 of the MOS-FET illustrated in FIG. 13 may comprise a metal, such as Ti, Al, TiN, TaN or W, polysilicon (B(boron)-doped: p-type or P(phosphorus)-doped; n-type), or Ni-FUSI (full silicide).

The semiconductor/insulator junction formed by sputter film deposition of the dielectric film such as Hf and then oxidation/nitridation of the dielectric film without exposure to atmosphere according to the present invention, had reduced fixed charges and interface states as compared with a junction formed by a process including transport under atmosphere. Therefore, favorable device characteristics were obtained including a C-V curve with less hysteresis as shown in FIG. 8 and reduced leakage current. The "interface state" means an electron energy level developed at the interface of a junction between semiconductors of different types or at the interface of a junction between a semiconductor and a metal or an insulator. A bond between atoms is broken to assume an unbonded state called "dangling bond" at the semiconductor surface forming the junction, with the result that an energy level is developed which is capable of capturing charges. An impurity and a defect which are present at the interface also develop energy levels, i.e., interface states, which can capture charges. The interface state, in general, exhibits a slow response time and is unstable and hence frequently exercises an adverse effect on the device characteristics. Therefore, the fewer the number of interface states is, the better the interface can be said. The interface state density is measured by the C-V method.

The invention claimed is:

1. A method of fabricating a semiconductor device, comprising:
a first step of cleaning a surface of a semiconductor substrate by:
introducing a gas containing at least $F_2$ or HF into a plasma generating chamber of a surface cleaning device having an arrangement in which the plasma generating chamber and a processing chamber are separated from each other by a shower plate, to generate plasma in the plasma generating chamber; and introducing a radical contained in the plasma from the plasma generating chamber into the processing chamber in which the semiconductor substrate is placed through the shower plate while introducing a gas containing at least an $H_2$ gas or an HF gas into the processing chamber; and
a second step of exposing the surface of the semiconductor substrate having been subjected to the first step to a hydride, with the substrate being at a temperature lower than a thermal decomposition temperature of the hydride.

2. The method of fabricating a semiconductor device according to claim 1, wherein the first and second steps are performed in the surface cleaning device.

3. The method of fabricating a semiconductor device according to claim 1, further comprising a fifth step of exposing the substrate to a hydride containing a semiconductor component after the second step, with the substrate being at a temperature equal to or higher than a thermal decomposition temperature of the hydride containing the semiconductor component to which the substrate is exposed.

4. The method of fabricating a semiconductor device according to claim 1, wherein the first and second steps are performed in the surface cleaning device,
the method further comprising a fifth step of transporting the semiconductor substrate into a CVD device and then exposing the substrate to a hydride containing a semiconductor component, after the first and second steps have been performed.

5. The method of fabricating a semiconductor device according to claim 4, further comprising a third step of forming a dielectric film over the surface of the semiconductor device having been subjected to the fifth step.

6. The method of fabricating a semiconductor device according to claim 5, wherein the third step includes sputter film deposition of one or more of Hf, HfSi, HfLa, HfAlLa, LaAl and La over the surface of the semiconductor device having been subjected to the fifth step, to form the dielectric film.

7. The method of fabricating a semiconductor device according to claim 5, further comprising a fourth step of changing the dielectric film into an insulating film by oxidation, nitridation or oxynitridation of the dielectric film.

8. The method of fabricating a semiconductor device according to claim 7, wherein the first, second, fifth, third and fourth steps are performed without exposing the substrate surface to atmosphere by moving the semiconductor substrate through a transfer chamber during the first, second, fifth, third and fourth steps.

9. The method of fabricating a semiconductor device according to claim 7, wherein the insulating film is a gate insulating film of a MOSFET.

10. The method of fabricating a semiconductor device according to claim 2, wherein the second step uses a hydride which is thermally decomposed at a temperature of not higher than 650° C.

11. The method of fabricating a semiconductor device according to claim 3, wherein the fifth step includes raising the substrate temperature to a temperature of not lower than the thermal decomposition temperature of the hydride containing the semiconductor component to allow a semiconductor single crystal to grow on the substrate.

12. The method of fabricating a semiconductor device according to claim 1, wherein: the second step is performed in a CVD device; and
the semiconductor substrate is moved from the cleaning device to the CVD device through a transfer chamber after the first step and is exposed to the hydride by the second step without exposure of the semiconductor substrate surface having been cleaned by the first step to atmosphere.

13. The method of fabricating a semiconductor device according to claim 1, further comprising a third step of forming a dielectric film over the surface of the semiconductor substrate having been subjected to the second step.

14. The method of fabricating a semiconductor device according to claim 13, wherein the third step includes sputter film deposition of one or more of Hf, HfSi, HfLa, HfAlLa, LaAl and La over the surface of the semiconductor device having been subjected to the second step, to form the dielectric film.

15. The method of fabricating a semiconductor device according to claim 13, further comprising a fourth step of changing the dielectric film into an insulating film by oxidation, nitridation or oxynitridation of the dielectric film.

16. The method of fabricating a semiconductor device according to claim 15, wherein the first to fourth steps are performed without exposing the substrate surface to atmosphere by moving the semiconductor substrate through a transfer chamber during the first to fourth steps.

17. The method of fabricating a semiconductor device according to claim 15, wherein the insulating film is a gate insulating film of the semiconductor device.

18. The method of fabricating a semiconductor device according to claim 1, wherein the second step uses a hydride which is thermally decomposed at a temperature of not higher than 650° C.

19. The method of fabricating a semiconductor device according to claim 1, further comprising: a sixth step of changing the substrate surface into an insulating film by oxidation, nitridation or oxynitridation of the substrate surface after the second step; a third step of forming a dielectric film over the insulating film formed by the sixth step; and a fourth step of changing the dielectric film formed by the third step into an insulating film by oxidation, nitridation or oxynitridation of the dielectric film.

20. An apparatus for fabricating a semiconductor device, comprising:
a transfer chamber;
a first processing device and a second processing device respectively coupled to the transfer chamber through opening-closing shutters;
a transfer controller for controlling a substrate transport mechanism in the transfer chamber and the opening-closing shutters; and
a process controller for controlling substrate processing steps to be conducted in the first and second processing devices, wherein the transfer controller includes a memory unit having a program which controls the substrate transport mechanism and the opening-closing shutters so that a substrate is transferred to the first processing device and then, after the processing in the first processing device, the substrate is transferred to the second processing device through the transfer chamber, wherein the first processing device is a surface cleaning device in which a plasma generating space is separated from a processing space by a shower plate, wherein the process controller includes a memory unit having a program which controls the first processing device so that a gas containing at least $F_2$ gas or HF gas is introduced into the processing space to generate a plasma in the processing space and a radical in the plasma is introduced from the plasma generating space into the processing space through the shower plate together with introducing a gas containing $H_2$ gas or HF gas into the processing space, and wherein the memory unit of the process controller further has a program which controls the second processing device so that the surface of a semiconductor substrate transferred to the second processing device is exposed to a hydride, with the semiconductor substrate being at a temperature lower than a thermal decomposition temperature of the hydride.

21. The apparatus for fabricating a semiconductor device according to claim 20, wherein the transfer controller controls the substrate transfer mechanism and the opening-closing shutters during the transfer of the substrate through the transfer chamber so that a series of the surface cleaning step in the first processing device and the hydride exposing step in the second processing device is conducted in a vacuum environment without exposing the substrate to the atmosphere.

* * * * *